United States Patent
Bennett et al.

(10) Patent No.: US 11,138,568 B2
(45) Date of Patent: Oct. 5, 2021

(54) CALENDAR-AWARE RESOURCE RETRIEVAL

(71) Applicant: Microsoft Technology Licensing, LLC, Redmond, WA (US)

(72) Inventors: Paul N. Bennett, Redmond, WA (US); Adam Fourney, Redmond, WA (US); Anne Loomis Thompson, Redmond, WA (US); Adam D Troy, Redmond, WA (US); Qian Zhao, Redmond, WA (US); Ragavenderan Venkatesan, Redmond, WA (US); Sandeep S. Sahasrabudhe, Redmond, WA (US); Ramakrishna B Bairi, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 445 days.

(21) Appl. No.: 15/992,795

(22) Filed: May 30, 2018

(65) Prior Publication Data

US 2019/0236555 A1    Aug. 1, 2019

Related U.S. Application Data

(60) Provisional application No. 62/623,391, filed on Jan. 29, 2018.

(51) Int. Cl.
*G06Q 10/00* (2012.01)
*G06Q 10/10* (2012.01)
(Continued)

(52) U.S. Cl.
CPC ....... *G06Q 10/1095* (2013.01); *G06F 3/0482* (2013.01); *G06F 9/4881* (2013.01);
(Continued)

(58) Field of Classification Search
None
See application file for complete search history.

(56) References Cited

U.S. PATENT DOCUMENTS

| 6,016,478 A * | 1/2000 | Zhang ............... G06Q 10/06314 |
| | | 705/7.19 |
| 7,082,402 B2 * | 7/2006 | Conmy ................ G06F 40/151 |
| | | 705/7.19 |

(Continued)

OTHER PUBLICATIONS

Dawson, Frank, and DerikStenerson. "RFC2445: Internet Calendaring and Scheduling Core Object Specification (iCalendar)." (1998) (Year: 1998).*

(Continued)

*Primary Examiner* — Gurkanwaljit Singh
(74) *Attorney, Agent, or Firm* — Schwegman Lundberg & Woessner, P.A.

(57) ABSTRACT

Generally discussed herein are devices, systems, and methods for resource retrieval. A method may include determining that a calendar event is scheduled to occur in a specified period of time, responsive to the determination, extracting content of a calendar event on a calendar of the messaging interface, generating a list of resources accessible by the user and related to the extracted content of the calendar event, ranking the resources by a comparison of the extracted content of the calendar event and the content of resources of the list of resources, and causing respective summaries of a specified number of the respective resources with higher respective ranks to be output on the display.

20 Claims, 8 Drawing Sheets

(51) Int. Cl.
*G06Q 10/06* (2012.01)
*G06F 30/27* (2020.01)
*G06F 9/48* (2006.01)
*G06F 9/50* (2006.01)
*G06N 20/00* (2019.01)
*G06F 16/2457* (2019.01)
*G06F 3/0482* (2013.01)

(52) U.S. Cl.
CPC .......... *G06F 9/50* (2013.01); *G06F 16/24578* (2019.01); *G06F 30/27* (2020.01); *G06N 20/00* (2019.01); *G06Q 10/06* (2013.01); *G06Q 10/06314* (2013.01); *G06Q 10/06315* (2013.01)

(56) References Cited

U.S. PATENT DOCUMENTS

| | | | | |
|---|---|---|---|---|
| 7,827,240 | B1* | 11/2010 | Atkins | G06Q 10/109 709/204 |
| 8,065,175 | B1* | 11/2011 | Lewis | G06Q 10/109 705/7.19 |
| 8,185,527 | B2* | 5/2012 | Piccinini | G06Q 10/087 707/732 |
| 10,353,937 | B2* | 7/2019 | Moeller-Bertram | G06N 5/022 |
| 10,979,521 | B2* | 4/2021 | Walsh | G06F 9/546 |
| 2001/0014866 | A1* | 8/2001 | Conmy | G06F 40/12 705/7.19 |
| 2001/0014867 | A1* | 8/2001 | Conmy | G06F 40/151 705/7.18 |
| 2005/0034079 | A1* | 2/2005 | Gunasekar | G06Q 10/10 715/753 |
| 2006/0229896 | A1* | 10/2006 | Rosen | G06Q 10/1053 705/321 |
| 2007/0250784 | A1* | 10/2007 | Riley | G06Q 10/10 715/764 |
| 2008/0114628 | A1* | 5/2008 | Johnson | G06Q 10/06311 707/792 |
| 2010/0174759 | A1* | 7/2010 | Piccinini | G06Q 10/087 707/805 |
| 2011/0093913 | A1* | 4/2011 | Wohlert | H04W 12/082 726/1 |
| 2011/0231409 | A1* | 9/2011 | Dhara | H04L 65/403 707/748 |
| 2013/0304442 | A1* | 11/2013 | Hu | G06F 30/20 703/6 |
| 2014/0172483 | A1* | 6/2014 | Bellers | G06Q 50/14 705/7.16 |
| 2016/0086116 | A1 | 3/2016 | Rao et al. | |
| 2016/0328683 | A1* | 11/2016 | Palavalli | G06F 9/485 |
| 2017/0161624 | A1* | 6/2017 | Porter | G06N 5/04 |
| 2017/0169375 | A1* | 6/2017 | Szeto | G06Q 10/1095 |
| 2017/0316022 | A1* | 11/2017 | Joshi | G06Q 30/0631 |
| 2017/0316387 | A1* | 11/2017 | Joshi | G06Q 10/1097 |
| 2018/0300398 | A1* | 10/2018 | Moeller-Bertram | G06K 9/623 |

OTHER PUBLICATIONS

Miller, A. (2018). Innovative management strategies for building and sustaining a digital initiatives department with limited resources. Digital Library Perspectives, 34(2), 117-136. doi:http://dx.doi.org/10.1108/DLP-08-2017-0029 (Year: 2018).*
Becerik, B. (2006). Implementation and value of online collaboration and project management systems in design and construction (Order No. 3215059). Available from ProQuest Dissertations and Theses Professional. (305341498) (Year: 2006).*
Miers, R. J. (1998). Evaluating the integration of scheduling software into the small construction business (Order No. 1392339). Available from ProQuest Dissertations and Theses Professional. (304456203) (Year: 1998).*
Nitithamyong, P. (2003). Analysis of success and failure factors in application of web-based project management systems in construction (Order No. 3124198). Available from ProQuest Dissertations and Theses Professional. (305314905) (Year: 2003).*
Young, P. S. C. (1994). Customizable process specification and enactment for technical and non-technical users (Order No. 9422217). Available from ProQuest Dissertations and Theses Professional. (304101969) (Year: 1994).*
Adomavicius, et al., "Context-Aware Recommender Systems", In Recommender systems handbook, Sep. 1, 2011, pp. 1-37.
Ailon, et al., "Threading machine generated email", In Proceedings of sixth ACM international conference on Web search and data mining, Feb. 4, 2013, pp. 405-415.
Avigdor-Elgrabli, et al., "Structural Clustering of Machine-Generated Mail", In Proceedings of the 25th ACM International on Conference on Information and Knowledge Management., Oct. 24, 2016, pp. 217-226.
Bahrainian, et al., "Augmentation of Human Memory: Anticipating Topics that Continue in the Next Meeting", In Proceedings of the Conference on Human Information Interaction&Retrieval, Mar. 11, 2018, pp. 150-159.
Bendersky, et al., "Learning from user interactions in personal search via attribute parameterization", In Proceedings of the Tenth ACM International Conference on Web Search and Data Mining, Feb. 6, 2017, 9 Pages.
Bennett, et al., "Inferring and using location metadata to personalize web search", In Proceedings of the 34th international ACM SIGIR conference on Research and development in Information Retrieval, Jul. 24, 2011, 10 Pages.
Bennett, et al., "Overview of the special issue on contextual search and recommendation", In Journal of ACM Transactions on Information Systems (TOIS) vol. 33, Issue 1, Mar. 2015, 7 Pages.
Braunhofer, et al., "A context-aware model for proactive recommender systems in the tourism domain", In Proceedings of the 17th International Conference on Human-Computer Interaction with Mobile Devices and Services Adjunct, Aug. 24, 2015, pp. 1070-1075.
Carmel, et al., "Promoting Relevant Results in Time-Ranked Mail Search", In Proceedings of the 26th International Conference on World Wide Web., Apr. 3, 2017, pp. 1551-1559.
Carmel, et al., "Rank by time or by relevance: Revisiting email search", In Proceedings of the 24th ACM International on Conference on Information and Knowledge Management., Oct. 17, 2015, pp. 283-292.
Dumais, et al., "Implicit queries IQ for contextualized search", In Proceedings of the 27th annual international ACM SIGIR conference on Research and development in information retrieval., Jul. 25, 2004, 1 Page.
Dumais, et al., "Stuff Ive seen: a system for personal information retrieval and re-use", In ACM SIGIR Forum, Jan. 29, 2016, 8 Pages.
Elsweiler, et al., "Understanding Refinding Behavior in Naturalistic Email Interaction Logs", In Proceedings of the 34th international ACM SIGIR conference on Research and development in Information Retrieval, Jul. 24, 2011, 10 pages.
Graus, et al., "Analyzing and Predicting Task Reminders", In Proceedings of the Conference on User Modeling Adaptation and Personalization, Jul. 13, 2016, pp. 7-15.
Grevet, et al., "Overload is overloaded: email in the age of Gmail", In Proceedings of the SIGCHI Conference on Human Factors in Computing Systems, Apr. 26, 2014, pp. 793-802.
Harvey, et al., "Exploring query patterns in email search", In Proceedings of the 34th European conference on Advances in Information Retrieval, Apr. 1, 2012, pp. 1-12.
Jerome, Friedman H.., "Greedy Function Approximation: A Gradient Boosting Machine", In Journal of Annals of Statistics, vol. 29, Issue 5, Oct. 2001, pp. 1189-1232.
Karatzoglou, et al., "Multiverse recommendation: n-dimensional tensor factorization for contextaware collaborative filtering", In Proceedings of the fourth ACM conference on Recommender systems, Sep. 26, 2010,, pp. 79-86.
Koren, et al., "Matrix factorization techniques for recommender systems", In Journal of Computer vol. 42, Issue 8, Aug. 2009, pp. 42-49.

(56) References Cited

OTHER PUBLICATIONS

Li, et al., "A contextual-bandit approach to personalized news article recommendation", In Proceedings of the 19th international conference on World wide web., Apr. 26, 2010, 10 Pages.

Mackay, Wendy E., "More than just a communication system: diversity in the use of electronic mail", In Proceedings the ACM conference on Computer-supported cooperative work, Jan. 1, 1988, pp. 344-353.

Mikolov, et al., "Distributed Representations of Words and Phrases and their Compositionality", In Proceedings of 27th Annual Conference on Neural Information Processing Systems, Dec. 5, 2013, pp. 1-9.

Miller, et al., "PocketLens: Toward a personal recommender system", In Journal of ACM Transactions on Information Systems (TOIS), vol. 22, Issue 3, Jul. 2004, pp. 437-476.

Mysore, Jayanth, "Access information quicker, do better work with Google Cloud Search", Retrieved from: https://www.blog.google/products/g-suite/access-information-quicker-do-better-work-google-cloud-search/, Oct. 3, 2017, 5 Pages.

Narang, et al., "Large-scale analysis of email search and organizational strategies", In Proceedings of the Conference on Conference Human Information Interaction and Retrieval, Mar. 7, 2017, pp. 215-223.

Ning, et al., "A context-aware resource recommendation system for business collaboration", In Proceedings of the 9th IEEE International Conference on E-Commerce Technology, Jul. 23, 2007, 4 Pages.

"International Search Report and Written Opinion Issued in PCT Application No. PCT/US19/013535", dated Mar. 21, 2019, 14 Pages.

Rendle, Steffen, "Factorization machines", In Proceedings of IEEE 10th International Conference on Data Mining, Dec. 13, 2010, 6 Pages.

Rendle, et al., "Fast context-aware recommendations with factorization machines", In Proceedings of the 34th international ACM SIGIR conference on Research and development in Information Retrieval, Jul. 24, 2011, pp. 635-644.

Resnick, et al., "GroupLens: an open architecture for collaborative filtering of netnews", In Proceedings of the ACM conference on Computer supported cooperative work, Oct. 22, 1994, pp. 175-186.

Rhodes, Bradley James., "Just-In-Time Information Retrieval", In Ph.D. Dissertation of Massachusetts Institute of Technology, Jun. 2000, 154 Pages.

Salton, et al., "Introduction to Modern Information Retrieval", In Publication of McGraw-Hill Book Company, 1986, pp. 200-215.

Shalev-Shwartz, Shai, "Online learning and online convex optimization", In Journal of Foundations and Trends in Machine Learning, vol. 4, No. 2, Feb. 2012, pp. 107-194.

Wang, et al., "Which to view: Personalized prioritization for broadcast emails", In Proceedings of the 25th International Conference on World Wide Web, Apr. 11, 2016, pp. 1181-1190.

Whittaker, et al., "Am I wasting my time organizing email: A study of email refinding", In Proceedings of the SIGCHI Conference on Human Factors in Computing Systems, May 7, 2011, 10 Pages.

Whittaker, et al., "Email overload: Exploring personal information management of email.", In Proceedings of the SIGCHI Conference on Human Factors in Computing Systems, Apr. 13, 1996, pp. 276-283.

Zamani, et al., "Situational Context for Ranking in Personal Search", In Proceedings of International World Wide Web Conferences Steering Committee, Apr. 3, 2017, pp. 1531-1540.

Zhao, et al., "Calendar-Aware Proactive Email Recommendation", In Proceedings of the 41st International ACM SIGIR Conference on Research & Development in Information Retrieval, Jul. 8, 2018, pp. 655-664.

* cited by examiner

CALENDAR-AWARE RESOURCE RETRIEVAL

PRIORITY APPLICATION

This application claims priority to U. S. Provisional Application Ser. No. 62/623,391, filed Jan. 29, 2018, and titled "CALENDAR-AWARE RESOURCE RETRIEVAL" the disclosure of which is incorporated herein by reference in its entirety.

BACKGROUND

The use of email has grown over the past several decades in terms of total volume (information overload) and in terms of the number of purposes for which email is used (functional overload). Email serves as not only a communication tool, but also as a repository of tasks, a personal archive, and a calendar tool. While a variety of research has focused on how to support this functional overload by directly integrating task support or calendar within email clients, little research has focused on how the information present in other data sources may be leveraged to mitigate the information overload and search problems present in searching or re-finding items across a repository of email.

SUMMARY

This summary section is provided to introduce aspects of embodiments in a simplified form, with further explanation of the embodiments following in the detailed description. This summary section is not intended to identify essential or required features of the claimed subject matter, and the combination and order of elements listed in this summary section are not intended to provide limitation to the elements of the claimed subject matter.

A system may include a display to provide user interface that provides a user access to functionality of a personal information management (PIM) application, the display providing a PIM interface that provides access to functionality of the PIM application, a processor, and a memory device coupled to the processor, the memory device including a program stored thereon, wherein the program, when executed, causes the processor to perform operations comprising determining that a calendar event is scheduled to occur in a specified period of time, responsive to the determination, extracting content of a calendar event on a calendar of the messaging interface, generating a list of resources accessible by the user and related to the extracted content of the calendar event, ranking the resources by a comparison of the extracted content of the calendar event and the content of resources of the list of resources, and causing respective summaries of a specified number of the respective resources with higher respective ranks to be output on the PIM interface.

A method may be performed by at least one processor of a computing system. The method may include receiving, by a user interface, an indication that a user has selected a recommended resource control of the user interface, responsive to receiving the indication, extracting content of a calendar event on a personal information management application of a user, the content including: a subject, one or more names of people attending or invited, a name of an organizer, a date and time, and text in a body, of the calendar event, generating a list of resources accessible by the user and related to the extracted content of the calendar event, ranking the resources by a comparison of at least two of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph, and causing respective summaries of a specified number of the resources with higher respective ranks to be displayed on the user interface.

At least one machine-readable storage medium including instructions for execution by processing circuitry to perform operations comprising extracting content of a calendar event on a personal information management application, the content including: a subject, one or more names of people attending or invited, a name of an organizer, and a date and time of the calendar event, identifying a list of resources accessible by the user and related to the extracted content of the calendar event, ranking the resources by a comparison of at least one of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph, and causing respective summaries of a specified number of the resources with higher respective ranks to be displayed on a display.

DETAILED DESCRIPTION

Figure 1:
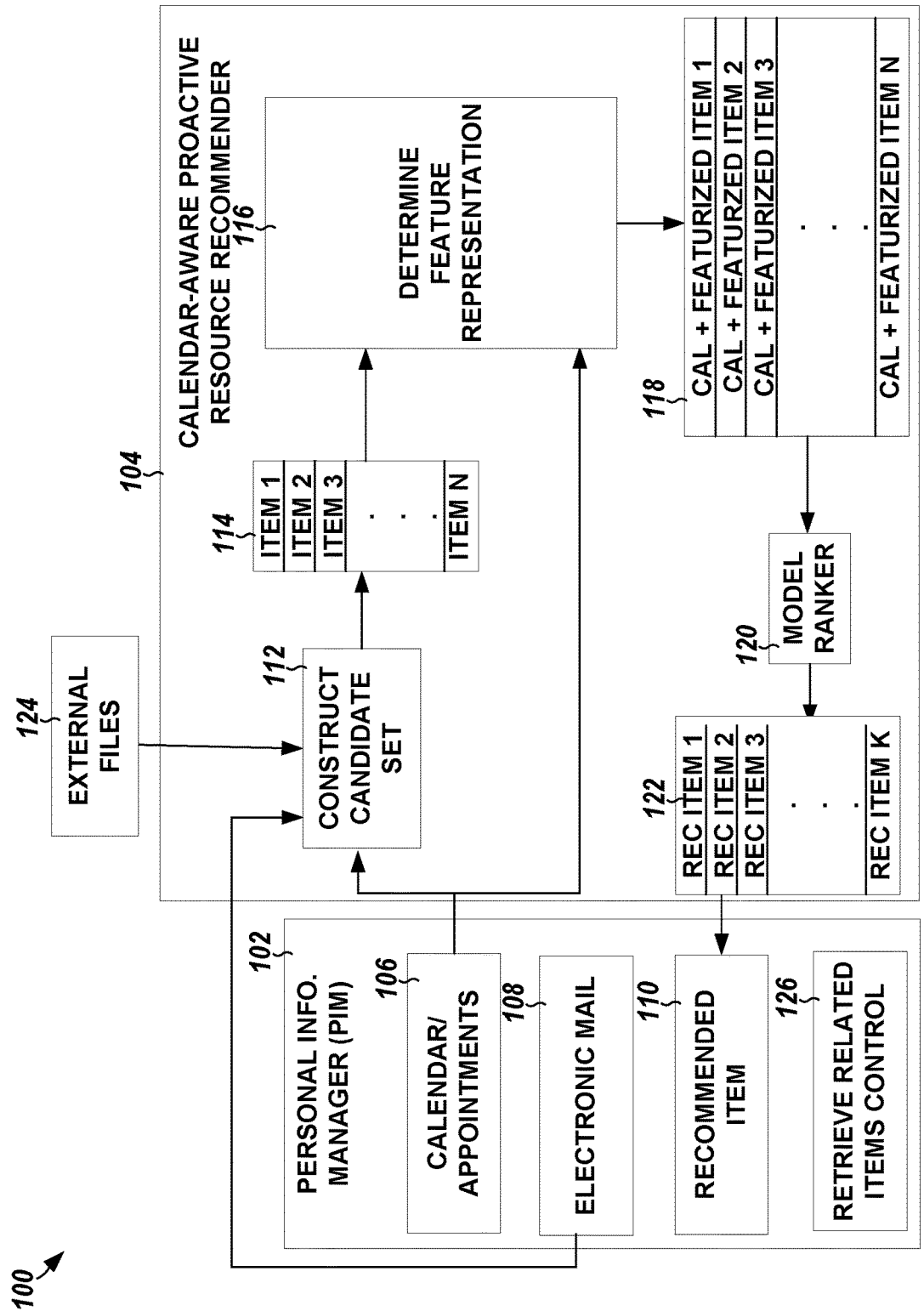
FIG. 1 illustrates, by way of example, a diagram of an embodiment of a system for calendar-aware resource retrieval.

In the following description, reference is made to the accompanying drawings that form a part hereof, and in which is shown by way of illustration specific embodiments which may be practiced. These embodiments are described in sufficient detail to enable those skilled in the art to practice the embodiments. It is to be understood that other embodiments may be utilized and that structural, logical, and/or electrical changes may be made without departing from the scope of the embodiments. The following description of embodiments is, therefore, not to be taken in a limited sense, and the scope of the embodiments is defined by the appended claims.

The operations, functions, or algorithms described herein may be implemented in software in some embodiments. The software may include computer executable instructions stored on computer or other machine-readable media or storage device, such as one or more non-transitory memories (e.g., a non-transitory machine-readable medium) or other type of hardware based storage devices, either local or networked. Further, such functions may correspond to subsystems, which may be software, hardware, firmware or a combination thereof. Multiple functions may be performed in one or more subsystems as desired, and the embodiments described are merely examples. The software may be executed on a digital signal processor, ASIC, microprocessor, central processing unit (CPU), graphics processing unit (GPU), field programmable gate array (FPGA), or other type of processor operating on a computer system, such as a personal computer, server or other computer system, turning such computer system into a specifically programmed machine. The functions or methods may be implemented using processing circuitry, such as may include electric and/or electronic components (e.g., one or more transistors, resistors, capacitors, inductors, amplifiers, modulators, demodulators, antennas, radios, regulators, diodes, oscillators, multiplexers, logic gates, buffers, caches, memories, GPUs, CPUs, field programmable gate arrays (FPGAs), or the like). Some of the functions or methods may include using a display, such as may be driven by the processing circuitry. The display may include an interactive or non-interactive screen. An interactive screen may be driven by a user input device that may include any type of user input devices that supports the various functions discussed in this document, such as a touchscreen, keyboard, keypad, touchpad, trackball, joystick, and mouse. A user interface device may receive input from the input device and allow the user to perform any other functions discussed in this document where user interface input is suitable. An output may be provided by way of graphics on display, audio through a speaker, or the like.

Email has been an important internet-based communication medium for more than twenty-five (25) years. While email was first designed for asynchronous communication, people have "overloaded" the use of email with other functions, such as task management and personal archiving. As online services and the web grow, email not only continues to serve these purposes, but an ever-increasing number (e.g., as a receipt file cabinet for e-commerce purchases, as a standard part of identity/authentication flow, and as calendar management tool, etc.). Regarding calendar management, because meeting arrangement and time negotiation often happen through email, nearly every modern email service—both web email and client applications—offer calendar management. Despite this integration, the majority of feature development has focused on moving information from email into a user's calendar, but little work has focused on the implications of calendar information for improving other functionality of a personal information management (PIM) service.

Discussed herein are embodiments that may include calendar-aware resource recommendation or resource data retrieval systems, devices, methods, and non-transitory machine-readable mediums. Embodiments may access data of a calendar event, filter resources (e.g., electronic mail, files, attachments, electronic contacts, e.g., email address, phone number, handle, username, or the like) based on the calendar event, and rank the filtered resources based on the content of the calendar event. The content of the calendar event may include text in a subject line, a body, people attending, tentatively attending, or invited and not attending, content of one or more attachments, date and time of the calendar event, location of the calendar event, an organizer of the calendar event, or the like. The calendar event may include a meeting, appointment, task, or the like. The resource may include a file, calendar event, electronic mail (email), or the like. The file may include an audio, text, image, video, other file or a combination thereof. The resource may include a resource local to a user (stored locally on a user's device) or remote to the user (accessible by the user through a network connection). A resource that is not filtered out, or otherwise is determined to be associated with the calendar-event may be preemptively retrieved or a link to the resource may be proactively provided to a user.

There are many types of prior resource recommendation systems including contextual information retrieval, personal search, context-aware and personal recommendation, email information extraction and classification, as well as email search and recommendation. In contrast to previous work, embodiments may use contextual signals like people, time, a relationship between resources, people, or resources and people for a proactive recommendation for resources related to a calendar event. Embodiments use factors that impact recommendation quality and may provide a tradeoff between factors and the impact of different modeling choices.

Embodiments disclosed herein provide a level of privacy not present in other recommender systems. The embodiments accomplish this, at least in part, by narrowing a library of resources that may be retrieved or recommended. The library of resources may be limited to resources directly accessible by a user. As used herein, directly accessible generally indicates that the user may navigate to and access the resource from their computer, whether the resource is local, remote, on a same network, or on a different network without violating a computer policy which enforces personal privacy, organizational privacy, or an access policy. No information regarding other users that is not allowed by the policy is disseminated in providing this resource recommendation. This contrasts with a recommender system that recommends a product that is commonly purchased with another product, among many other recommender systems. These other systems inherently provide information regarding other users. The privacy of the recommender systems discussed herein provide a technical advantage over the prior recommender systems.

Building effective recommendation models over personal data may be challenging in terms of privacy. Many predictive models have access to large amounts of (implicitly or explicitly labeled) data. However, personal content typically comes with privacy challenges that prevent common approaches from being applied. For example, even a simple bag-of-words model may leak information from one person to another via the weight learned of the importance of single word. In this domain, the contextual nature of this task is considered to produce a representation where models may be trained or used across users with no risk to privacy—allowing the model to leverage the maximum amount of data possible. These contextual similarity features are measures of the match between the context (a meeting item) and a candidate (an email, or file). For example, a feature may be deployed to determine the similarity between the set of people in a meeting and the set of people on an email while revealing no private information about what people are involved. Likewise, this data may be further parameterized by incorporating information from the user's own information such as the frequency of contact. The importance of these features may then be trained or used across users effectively allowing enough data to learn about more complex interaction and produce more effective models. A proof-of-concept experiment demonstrates that an ability to learn effective recommendation models using even a small such set of contextual similarity features is possible. More generally, these similarity features may be parameterized to further enable cross-user learning without leaking personal information across users. The experiments and other details are described in an Appendix of Provisional Patent Application No. 62/623,391, titled "Calendar-Aware Resource Data Retrieval", and filed on Jan. 29, 2018, which is incorporated by reference in its entirety.

Calendar data offers a source of information, as it provides both an indication of a likely time horizon for an information need together with related people (e.g., people in an invitation) and content (subject+body). Embodiments herein may leverage this information through a "zero-query" Recommender System. The recommender system may proactively select and display potentially useful resources to users based on one or more upcoming calendar events. The display and ease of access to the resources may aid calendar event preparation, calendar event follow up, or the like.

A large proportion of resource access is related to meetings. An effectiveness of a variety of recommender structures for proactively recommending content are considered. Four categories of factors are considered in each of the recommenders: the amount of resource content, resource-recency, calendar-resource content match, and calendar-resource people match. All four factors may have positive effects on the usefulness of resources to calendar event preparation.

Embodiments may determine whether the contextual information offered in calendar items may be used for more than simply reminding people of upcoming appointments. Calendar items are a strong indicator of a person's future intent and identify a time for the appointment (e.g., informing a likely horizon of need) as well as often including the people involved, a subject, and a description. This forms a rich contextual basis to explore, proactively finding and recommending resources the user will likely need for an upcoming calendar appointment.

Proactive email recommendation may both improve email search efficiency and reduce the difficulty of query specification by enabling "search by meeting". In embodiments, embodiments may not wait for users to issue the query, but may proactively form and issue the query for the user based on what is known about the user's current and future calendar appointments, (a "zero-query" search experience). The search may be activated by selecting an appointment or by default (e.g., predicting both calendar item in focus and associated information).

FIG. 1 illustrates, by way of example, a diagram of an embodiment of a system 100 for calendar-aware proactive resource retrieval. The system 100 as illustrated includes personal information manager (PIM) 102 and a recommender system 104. The PIM 102 may include a calendar interface 106, email interface 108, and recommended item interface 110. Examples of PIMs include Outlook from Microsoft Corporation of Redmond, Wash., United States of America (USA), Gmail from Google of Mountain View, Calif., USA, EssentialPIM from Astonsoft Ltd. of Estonia, Thunderbird from the Mozilla Foundation of Mountain View, Calif. USA, eM Client from eM Client, Inc. of San Francisco, Calif. USA, and Zimbra Desktop from Synacor, Inc. of Buffalo, N.Y. USA, among others. Not all PIMs include email and calendar functionality. Embodiments may integrate with a separate calendar and email PIMs so that the PIM 102 does not need to include either or both the email and calendar functionality.

A user may manage appointments, meetings, tasks, and/or reminders through the calendar interface 106. The calendar interface 106 provides controls for a user to record data regarding a date, time, people attending, subject, attachment, a description of an event (e.g., a body), a reminder time, or the like. There are many configurations for calendar applications and embodiments are not limited to a particular calendar configuration.

A user may manage electronic mail through the email interface 108. The email interface 108 provides an interface for a user to organize, access, search, store, delete, or perform other operations on email. There are many configurations for email applications and embodiments are not limited to a particular email configuration.

The PIM 102 as illustrated further includes a retrieve related items control 126. The control is a software item that, in response to being selected (e.g., by click and release, touch on a touch screen, an audio command, a gaze dwell, or the like), provides one or more signals to the recommender system 104 to initiate operations for populating the recommended item interface 110. The operations of the recommender system 104 may be initiated in response to a user selecting the retrieve related items control 126, a date and time elapsing, a specified period of time elapsing, or the like.

The recommender system 104 may include application programming interfaces (APIs) or other processing circuitry or software operating on processing circuitry that may provide calendar-aware resource recommendations to a user. The recommender system 104 as illustrated constructs a candidate set 114 at operation 112. The candidate set 114 may be constructed from the email associated with the email interface 108, external data 124, or calendar events associated with the calendar interface 106. The operation 112 may be a coarse filter for all the files or other resources accessible by the user associated with the recommender system 104. The operation 112 may return one or more files attached to a calendar event, attached to an email to or from a person attending or organizer of the calendar event, authored by a person attending or organizer of the calendar event, including a same or similar word or phrase in the subject, body, or other portion of the calendar event, or other file determined to be related, even remotely to the calendar event and accessible by the user of the PIM 102 (e.g., the user logged into the PIM 102).

The external data 124 may be stored on or obtained from the user's hard drive, a shared drive, on the cloud, or other files external to the PIM 102. The candidate set 114 may include items that pass through the coarse filter of the operation 112. The candidate set 114 may include one or more emails, email attachments, files authored by a person attending or an organizer of a calendar event, files including subject matter related to a subject or other content in the calendar event, or the like. The data is not limited in type and may include text, audio, image, a universal resource locator (URL), or video data, a combination thereof, or the like.

At operation 116 a feature representation of each item of the candidate set 114 may be determined. The feature representation may include an amount of content, resource recency, content match, and/or people match. The amount of content may include a length of a resource and/or whether the resource includes an attachment (e.g., in an example in which the resource is an email). The resource length may include a number of words in the subject (e.g., title) and body. The resource length may be converted to a quantile which indicates the resource length relative to all other resources in the candidate set 114. Whether the resource includes an attachment may be set to "1" if the resource includes an attachment and "0" if the resource does not include an attachment.

The resource recency indicates a time difference between the current time and one of a time the resource was created, a time the resource was last accessed, a time the resource was last modified, a time the resource was last saved, or the like. The resource recency may be converted to a quantile that indicates the resource length relative to all other resources in the candidate set 114.

The content match score may include a content match score and/or a subject match score. The content match score may include a cosine similarity between word count vectors of the resource and the calendar event's content (e.g., including both the subject and the body). The subject match score may include a cosine similarity between a word count vector of the resource's content (e.g., one or more of subject and body) and the calendar event's subject.

The people match may include a people match score, a from attendee score, and/or a from organizer score. The people match score may include a Jaccard index of the people of the resource (e.g., author(s) or people mentioned in the body of the resource) and people attending, invited to, or organizing the calendar event. The from attendee score may be "1" if the resource was an email from or an attachment to an email from, or an author of the resource is an attendee, else the attendee score may be "0". The from organizer score may be "1" if the resource was an email from or an attachment to an email from, or an author of the resource is an organizer, else the organizer score may be "0".

Calendar event and featurized items 118 may be provided to a model ranker 120. The model ranker 120 may determine, based on a feature matching and/or machine learning technique, which items are most likely to pertain to the calendar event. The model ranker 120 may provide a ranked list of top-k recommended items 122 based on the likelihood that the items pertain to the calendar event. The top-k (k≤N) items may be in terms of likelihood and may be provided to the PIM 102. The PIM 102 may provide a list of the top-k items in a recommended item interface 110 to the user. The recommended item interface 110 may include a description of each of the items and a link, that when selected by a user, provides a user a view of the item.

The system 100 specifically focuses on calendar events based on the observation that in work environments, people heavily rely on both emails and calendar events to organize their daily activities and necessary information. The system 100 has access to a user's calendar interface 106, and gains a context including the time, duration, and the content of a person's upcoming information needs. The system 100 may learn the usefulness of emails, and other items (sometimes called resources) with respect to the tasks of preparing for or hosting calendar events. Usefulness is a stricter criterion than relevance (and preference), because resources may be highly topically relevant in terms of content to a calendar event but may have no utility for preparation for the calendar event itself. The system 100 may update the models through online machine learning techniques.

Embodiments may consider one or more of (1) how much resource access is related to a calendar event, (2) what factors affect whether people prepare for a meeting, what factors affect the usefulness of resources to a meeting and how, (3) what models to use for resource recommendation, and (4) the role of resource recency (e.g., creation date and time or access date and time) in the resource recommendation.

Figure 2:
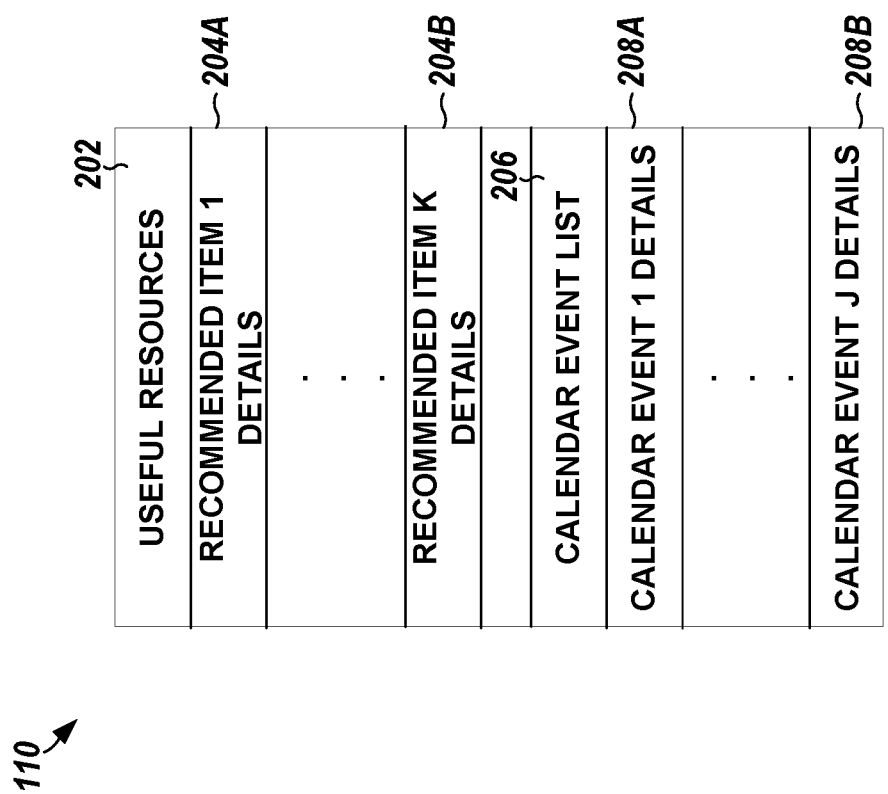
FIG. 2 illustrates, by way of example, a diagram of an embodiment of a recommended item interface.

FIG. 2 illustrates, by way of example, a diagram of an embodiment of the recommended item interface 110. The recommended item interface 110, as illustrated, includes useful resources 202 and calendar events 206. The recommended item details 204A and 204B in the useful resources 202 correspond to the recommended items 122 from the model ranker 120 and the selected calendar event of the calendar events 206. In response to a user selecting one of the calendar event details 208A-208B, the recommended item details 204A-204B corresponding to the calendar event of the selected calendar event details 208A-208B may be displayed. In response to a user selecting the recommended item details 204A-204B, the resource corresponding to the selected recommended item may be retrieved and displayed.

As previously discussed, the recommended item interface 110 may include two display panels, such as separate windows, ribbons, pop-up windows or other formats. One panel may list the upcoming calendar events of the user (e.g., ordered by time, such as in the calendar events 206) and another panel may present a list of resource recommendations for the calendar event selected in the other panel (e.g., in the useful resources 202). In desktop or laptop screens with standard sizes, a specified number of resources and meetings may be displayed and a user may scroll (e.g., up, down, left, or right) in either panel to see more resources or calendar events. By default, the current or the first upcoming calendar event may be selected and users may switch focus to a different calendar event by selecting the calendar event subject (clicking a separate link "detail" opens a pop-up with the details of the calendar event, e.g. content). One or more of the calendar events 206 and the useful resources 202 may be refreshed with a fixed time interval (five minutes or more or less time). In one or more embodiments, users will not perceive the refresh unless the list of calendar events changes or the list of resource recommendations changes. Users may also manually refresh the calendar events 206 or useful resources 202 recommendations by clicking a "Refresh" or similar control.

Users may select one of the recommended item details 204A-204B to open a pop-up with the full content of the selected resource. A shortened version of the resource content may be displayed along with the resource subject in the recommended item details 204A-204B. In one or more embodiments, a user may preview the full content of the resource by hovering on the shortened preview in the recommended item details 204A-204B.

Figure 3:
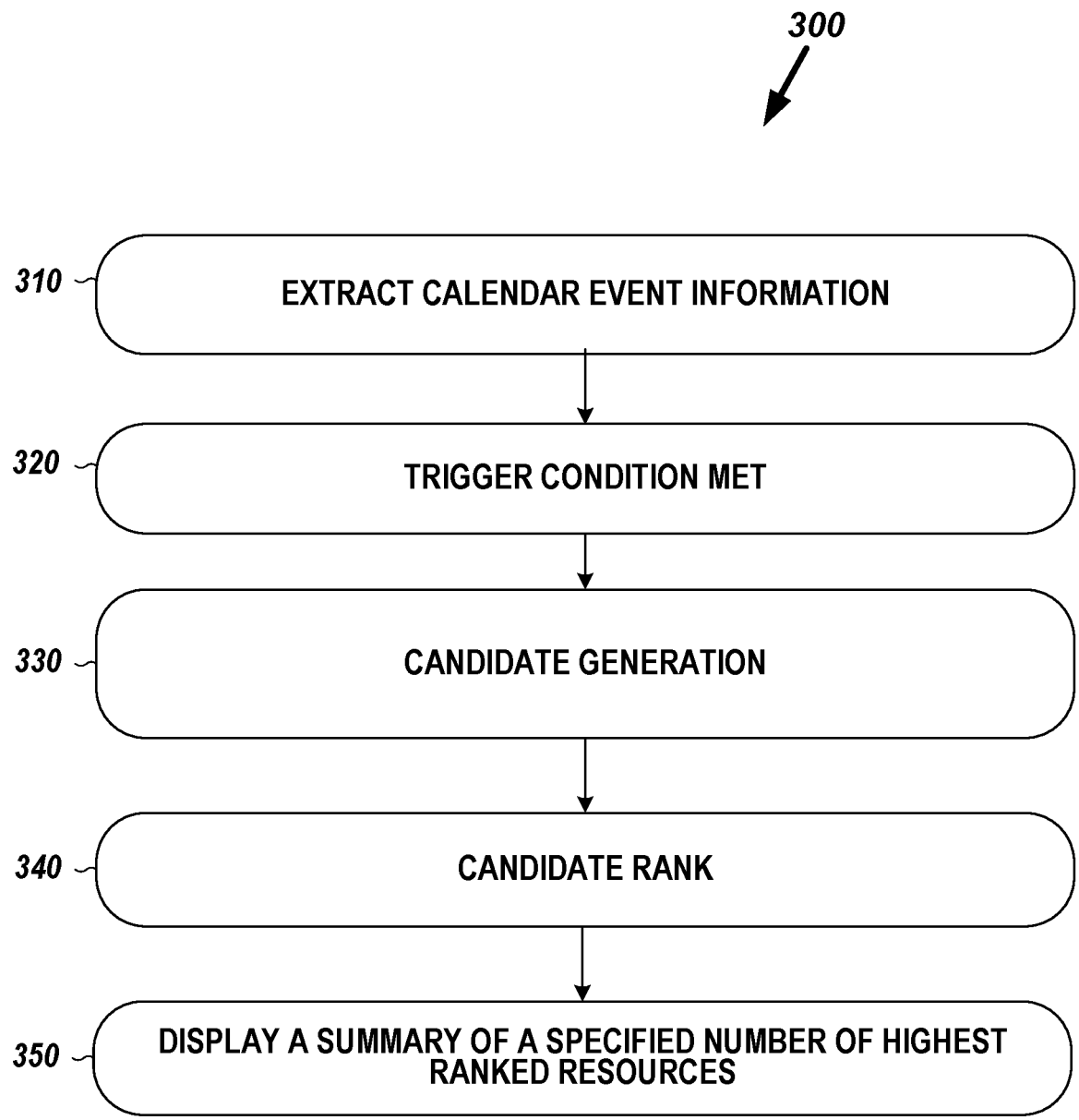
FIG. 3 illustrates, by way of example, a diagram of an embodiment of a method for calendar-aware resource retrieval.

FIG. 3 illustrates, by way of example, a diagram of an embodiment of a method 300 for calendar-aware resource recommendation. The method 300, as illustrated, includes extracting calendar event information, at operation 310; detecting a trigger condition is met, at operation 320; generating a candidate resource set, at operation 330; ranking the candidates of the generated candidate resource set, at operation 340; and displaying a summary of a specified number of highest ranked resources (or providing one or more signals that cause the display of the summary of the specified number of highest ranked resources), at operation 350.

Figure 4:
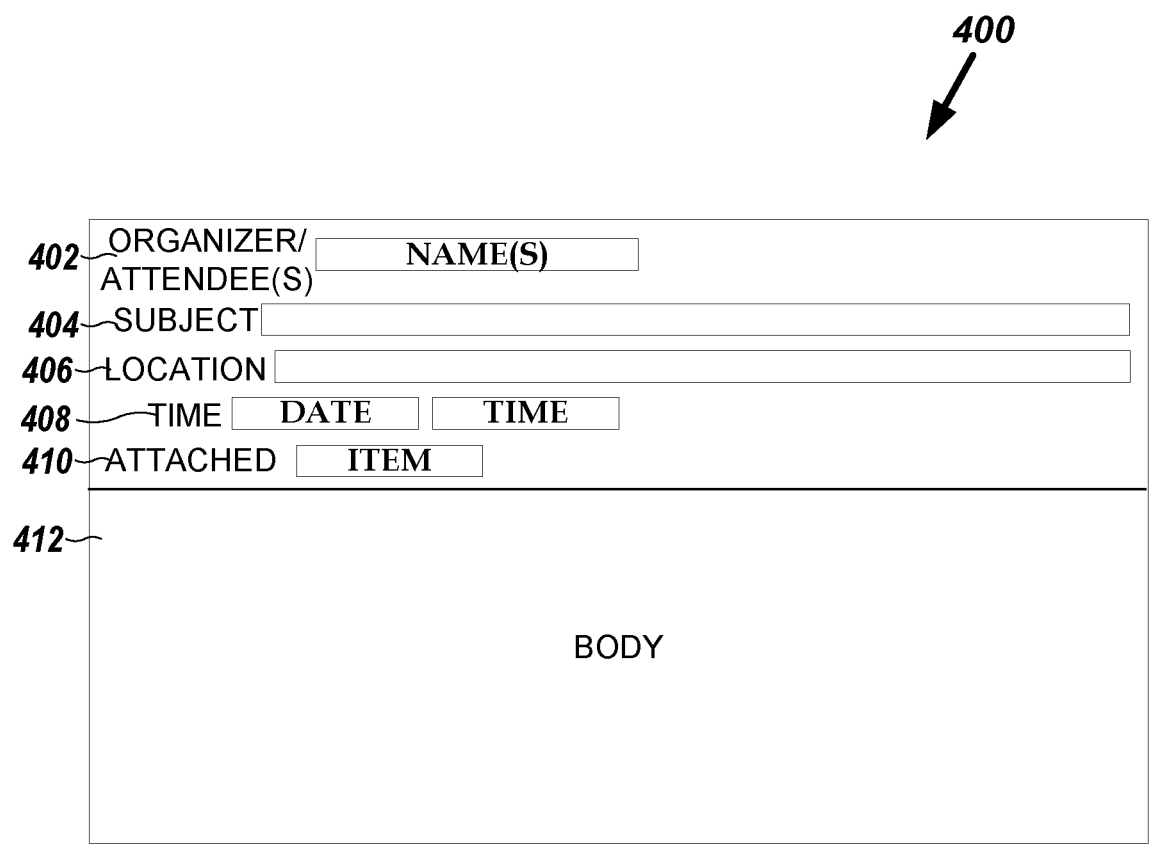
FIG. 4 illustrates, by way of example, a diagram of an embodiment of a calendar event.

Operation 310 may include extracting, from a calendar event, the subject, body, and people involved in the calendar event. Operation 310 may include extracting the upcoming calendar events, M, with same or similar information from the current user. The calendar events may be stored in a memory, such as in an eXtensible Markup Language (XML), Hypertext Markup Language (HTML), or another format. FIG. 4 illustrates a view of an embodiment of a calendar event.

The trigger condition may include a user selecting a calendar event, a specified date or time being reached, a specified period of time elapsing, a determination that a calendar event is scheduled to begin in a specified period of time (e.g., a half hour, fifteen minutes, ten minutes, five minutes, or other period of time), a prediction that a specific calendar event should be a current focus, or the like. In response to the operation 320, key words may be extracted from the meeting's subject and body text (e.g., taking a specified number of top key words ranked according to a key word ranking technique (e.g., term frequency-inverse document frequency (TF-IDF)) with respect to the content of M).

The operation 330 may include, in embodiments in which a resource search service is provided by the PIM 102, querying the service with the extracted key words and one or more of the people involved in the meeting, m (including attendees and the organizer). In some embodiments, additionally or alternatively to the email search service, a hard drive (e.g., a "C:" drive) may be searched for resources with the extracted key words and one or more of the people involved in the meeting. The resources returned from this search is denoted as the candidate set, S. The operation 112 may include the operation 330.

The operation 340 may include ranking the resources in S according to a ranking technique of a variety of different ranking techniques. The ranking technique may be different for different recommender techniques, as detailed in Table 2, for example. This ranked set of resources may be denoted as R. The method 300 may include returning R. The method 300 may further include displaying details of each resource R (as the recommended item details 204A-204B) in response to a user selecting the meeting m (e.g., a calendar event) such as the calendar event details 208A-208B. The operation 116 and/or operations performed by the model ranker 120 may be a part of the operation 340.

The method 300 is an embodiment of a recommendation flow when a calendar event is selected by the user or by default. Note that the input of the method 300 may include additional meetings in the current user's calendar beyond the one that is selected (by the user or by default). In one or more embodiments, the operations 320, 330, and 340 may be performed in advance, such that the ranked candidates are provided on the recommended item interface 110 through a memory access.

FIG. 4 illustrates, by way of example, a diagram of an embodiment of a view of a calendar event 400. The calendar event 400 may be stored in an XML, HTML, or other format, with metadata describing the content of the calendar event. The calendar event 400 as illustrated includes organizer(s), attendee(s), and/or invitee(s) 402, a subject 404, a location 406, a time 408, attachment(s) 410, and a body 412. The subject 404 generally summarizes a content to be covered in the calendar event 400. The location 406 generally indicates a physical location or whether the calendar event 400 will take place over the phone or web. The time 408 is generally time zone dependent and indicates a date and time of the calendar event 400 and sometimes indicates a duration of the calendar event 400. The attachment(s) 410 are resources that the organizer (or an invitee or attendee) deem to be relevant to the calendar event 400. The body 412 includes text, images, or other data describing the content of what is to be accomplished in the calendar event 400. Any of the information of the calendar event 400 may be used to help determine which resources to provide to a user attending, organizing, or following up on the calendar event.

Figure 5:
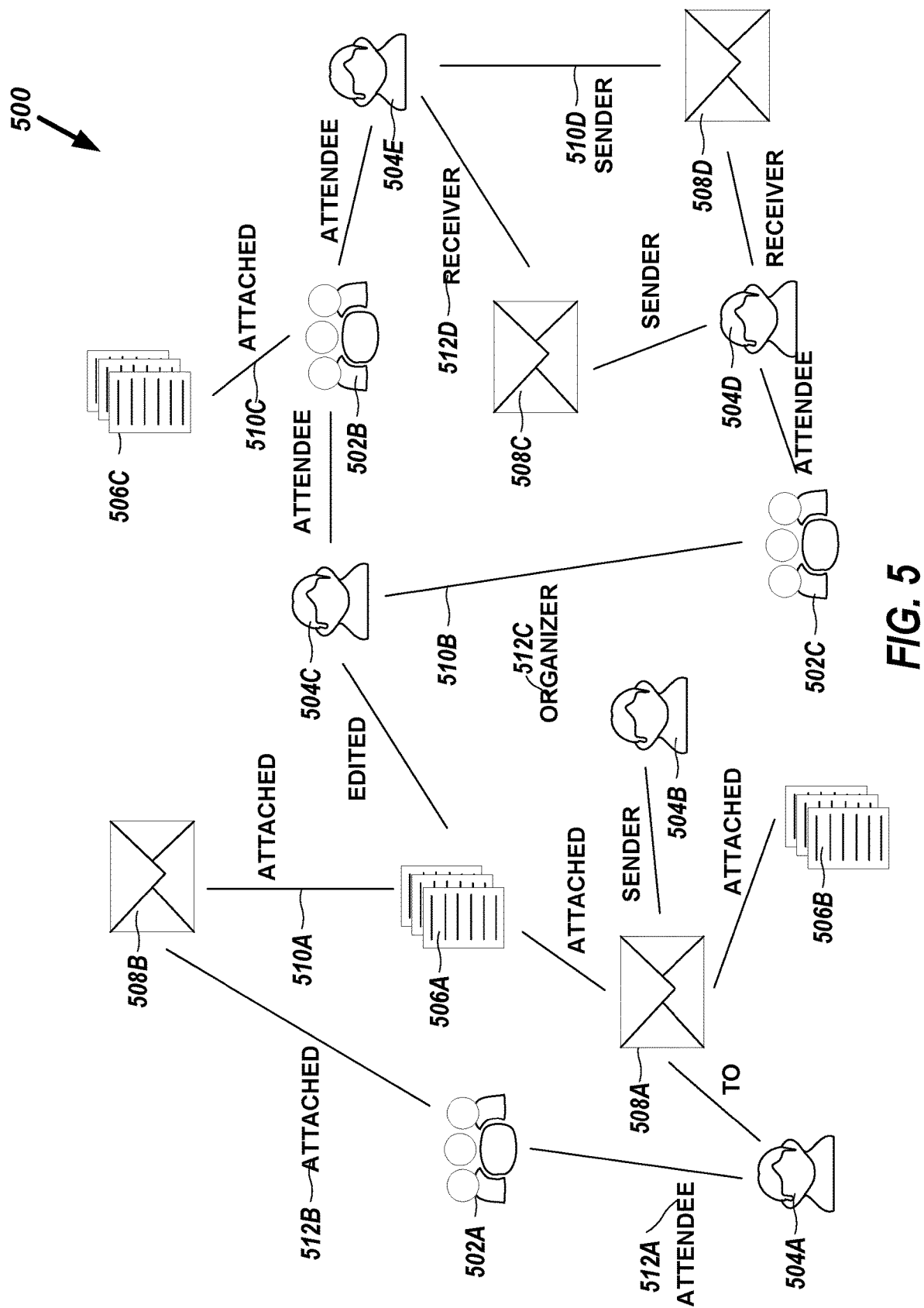
FIG. 5 illustrates, by way of example, a diagram of an embodiment of a heterogeneous graph detailing connections between calendar events, people, and resources.

FIG. 5 illustrates, by way of example, a diagram of an embodiment of a heterogeneous graph 500 detailing connections between entities, such as calendar events 502, people 504, and resources 506 and 508. The resources may further include external postings by a user, such as a blog post, a Yammer post, a SharePoint document, a Google Drive document, a shared Box document, or the like. The calendar events 502 include calendar events 502A, 502B, and 502C. The people 504 include people 504A, 504B, 504C, 504D, and 504E. The resources 506 include files 506A, 506B, and 506C. The resources 508 include emails 508A, 508B, 508C, and 508D. The graph 500 includes connections 510A, 510B, 510C, and 510D. For each of the connections 510A-510E, the graph 500 includes a respective label (e.g., labels 512A, 512B, 512C, and 512D). Not all connections include reference numbers and not all labels include reference numbers to not obscure the view of the graph 500.

A connection 510A-510D indicates a direct relationship between entities (e.g., a person, resource, or meeting) on each end of the connection. A label 512A-512D indicates the nature of the relationship between the entities on each end of the connection 510A-510D. The labels, sometimes called relationship types, may include "shared" for a person that has shared a resource; "to" such as for a resource provided to a person; "sender" for a person that has provided a resource; "organizer" for a person that organized a calendar event; "attendee" for a person that has accepted an invitation to attend a calendar event; "invited" for a person that has not responded to an invitation to attend a calendar event; "edited" for a person that has modified a resource; "created" for a person that has authored a resource; or the like.

Figure 6:
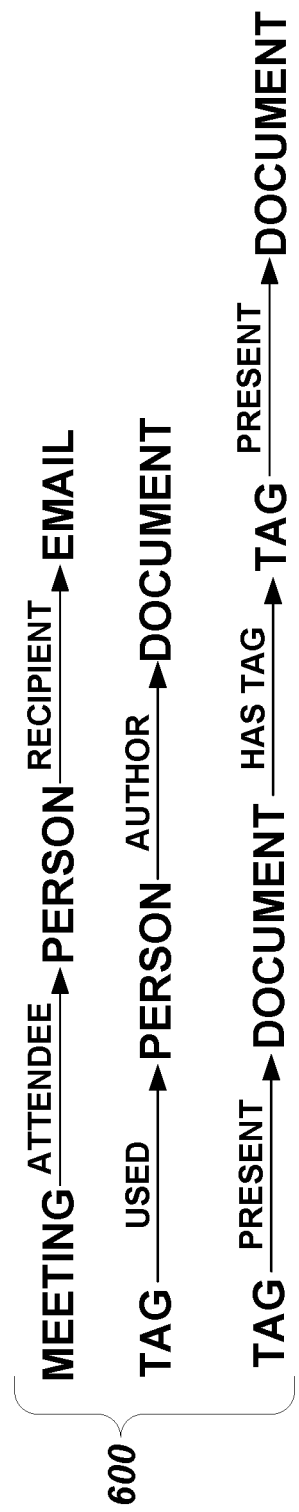
FIG. 6 illustrates, by way of example, a diagram of an embodiment of meta-paths.

A string of connections may be combined to from a meta-path between people, resources, and/or calendar events. FIG. 6 illustrates, by way of example, a diagram of embodiments of meta-paths 600. The meta-paths 600 may include more types of connections between resources, people, and calendar events than the graph 500. The connections may include subsets of the resources or calendar events, such as may include a tag, key word, relationship between people (e.g., role at an organization, such as supervisor, manager, engineer, officer, programmer, developer, manufacturing specialist, or another role), or the like. The meta-paths 600 may each be related to a score that defines a likelihood the resource is relevant to a calendar event connected in the meta-path. A connection between a calendar event and a resource may include one or more "atomic meta-paths" from which all meta-paths may be derived. Each of the atomic meta-paths may be related to the score and the atomic meta-paths that form a connection between the calendar event and the resource may be combined to determine a final score for the connection.

Given a calendar event 502A-502C, entities connected directly or indirectly to the calendar event 502A-502C may be ranked based on their distance (number of connections separating) from the calendar event 502A-502C and their relevance (e.g., the atomic meta-paths separating the calendar event 502A-502C and the resource). The candidates to be ranked may be determined using all directly or indirectly connected candidates, a ranking, or a weighted random walk, or based on their distance to the calendar event 502A-502C. The ranking may be used to recommend one or more resources to the user. Machine-learning models, such as a model trained with a supervised machine learning technique to solve a regression problem, may be used to rank and/or filter the one or more resources. Examples of such machine-learning techniques include a linear regression or a random forest, among others. Features evaluated in the machine-learning technique may include temporal, structural, and/or semantic features, such as those previously discussed regarding FIG. 1.

The temporal features may include a recency, such that a resource exchanged closer to the calendar event date/time or to the calendar event creation date/time is weighted greater than other resources. In a recurrent calendar event, a resource provided after a previous occurrence of the calendar event may be weighted greater than other resources.

The structural features may include relationships between entities (e.g., considering the labels 512A-512D). The meta-paths 600 provide a consideration of the structure of a relationship between entities and a calendar event. The meta-paths 600 may also provide semantic meaning to the structure of the relationship, such as through the labels 512A-512D.

In one or more embodiments, a relevance measure between entities of a heterogeneous network may be determined using a heterogeneous similarity. There are a variety of ways to determine a heterogeneous similarity between items (e.g., a calendar event and a resource).

The relevance measure may include a graph traversal technique (e.g., consistent with the relevance equation). The graph traversal technique may operate efficiently on large graphs.

Figure 7:
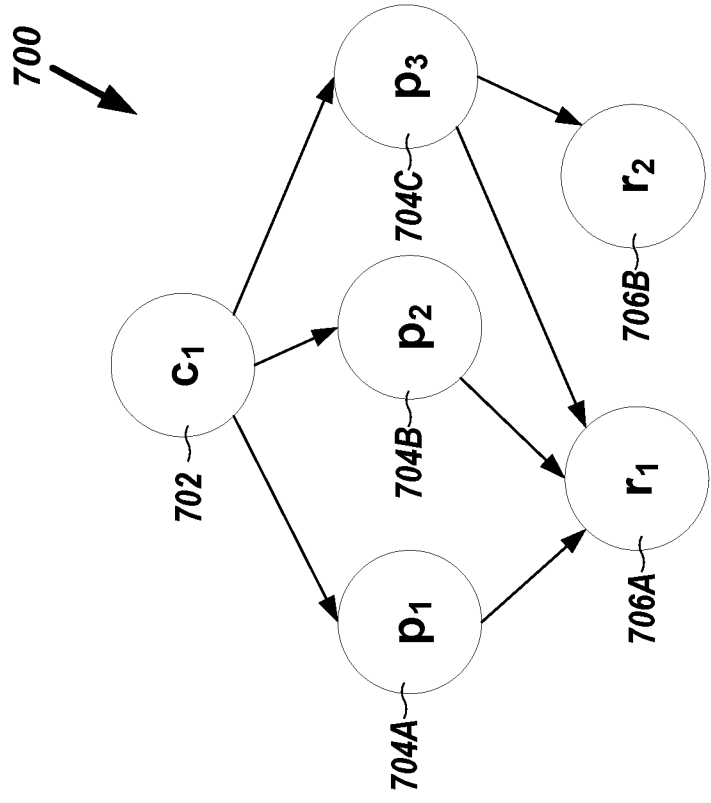
FIG. 7 illustrates, by way of example, a diagram of an embodiment of a resource-relation graph.

FIG. 7 illustrates, by way of example, a diagram of an embodiment of a resource-relation graph 700. The resource-relation graph 700 illustrates all connections from a calendar event 702 to resources 706A and 706B within a specified number of connections 510. The resources 706A-706B may be connected to the calendar event 702 by people 704A, 704B, and 704C. The ranking of the resources 706A-706B may be based on the number of independent connections from the calendar event 702 to the resource 706A-706B in the resource-relation graph 700. In the embodiment illustrated in FIG. 7, the resource 706A may be ranked higher than the resource 706B because the number of independent connections to the resource 706A (e.g., three in the embodiment of FIG. 7) is greater than the number of independent connections to the resource 706B (e.g., one in the embodiment of FIG. 7).

Based on the set of meta-paths, a feature vector may be determined for each entity to be ranked. A score may be determined based on the determined feature vector. The operation 330 or 340 may include a content comparison (as previously discussed). The content comparison may include determining a content feature vector, such as by using a term frequency-inverse document frequency (TF-IDF) comparison of words or strings of characters in the calendar event and the resources. A dot product of a content feature vector of the resource and the content feature vector of the calendar event may be used as a content similarity score.

The scores of the content, structure, and temporal similarities may be combined into an overall score that is used for resource ranking, such as by the model ranker 120 or at operation 340. The operation 112, 116, 330, or 340 operations performed by the model ranker 120 may include one or more operations discussed regarding FIGS. 5-7.

Figure 8:
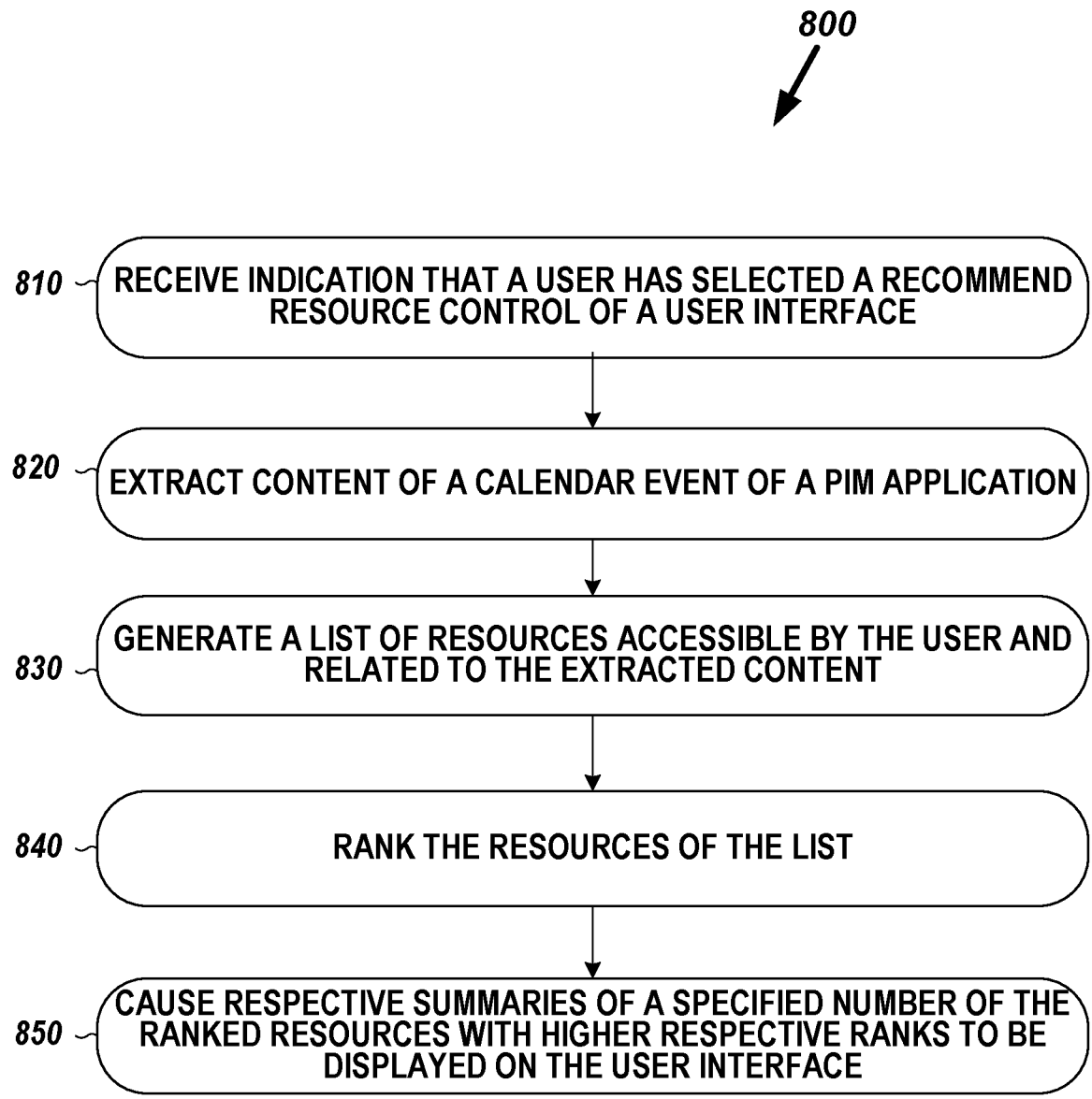
FIG. 8 illustrates, by way of example, a diagram of an embodiment of a method for recommending a resource for a user access.

FIG. 8 illustrates, by way of example, a diagram of an embodiment of a method 800 for calendar-aware resource recommendation/retrieval, such as may include more privacy than current recommendation/retrieval techniques. The method 800 as illustrated includes receiving an indication that a user has selected a recommend resource control of the user interface, at operation 810; extracting content of a calendar event on a personal information management application of a user, at operation 820; generating a list of resources accessible by the user and related to the extracted content of the calendar event, at operation 830; ranking the resources of the list, at operation 840; and causing respective summaries of a specified number of the resources with higher respective ranks to be displayed on the user interface, at operation 850. The indication, at operation 810, may be received by a user interface. The operation 820 may be performed responsive to receiving the indication at operation 810. The content of operation 830 may include one or more of a subject, one or more names of people attending or invited, a name of an organizer, a date and time, and text in a body, of the calendar event. The operation 840 may include a comparison of at least two of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph.

The method 800 may further include receiving, by the user interface, a first indication that the user has selected a summary of the respective summaries. The method 800 may further include retrieving the resource associated with the selected summary. The method 800 may further include causing the selected summary to be displayed on a display. The method 800 may further include determining, using an online supervised machine learning technique, a feature vector for each resource, the feature vector indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource. The operation 840 may further include, wherein ranking the resource includes ranking the resources based on the determined feature vector.

The feature vector may include data indicating the amount of content in the resource relative to the one or more other resources of the resources and the operations further comprise determining the number of words in the body and title, combined, and converting the number of words to a quantile based on the amount of content in the resource relative to the one or more other resources. The feature vector may include data indicating whether the resource includes one or more attachments.

The feature vector may include data indicating a content similarity between the resource and the content of the calendar event and the operations further comprise determining a similarity between content of the resource and the subject of the calendar event. The feature vector may include data indicating a content similarity between the resource and the content of the calendar event. The method 800 may further include determining a similarity between content of the resource and the subject and body of the calendar event.

The feature vector may include data indicating a person match between the name of one or more people attending, invited to, or organizer of the calendar event and the name of one or more people in the resource and the operations further comprise determining a Jaccard index based on the name of one or more people attending, invited to, or organizer of the calendar event and the name of one or more people in the resource, wherein the name of one or more people in the resource includes one or more of an author or co-author, a sender, a receiver, a copy contact, a person that last modified the resource, or a person mentioned in a body of the resource. The feature vector may include data indicating whether the organizer is an author or co-author, a sender, a receiver, a copy contact, a person that last modified the resource, or a person mentioned in a body of the resource.

The feature vector may include data indicating whether an attendee or invitee of the calendar event is an author or co-author, a sender, a receiver, a copy contact, a person that last modified the resource, or a person mentioned in a body of the resource. The method 800 may further include generating the resource-relation graph with resources and calendar events as nodes of the connected graph and respective labelled edges between nodes of the connected graph, wherein labels of the labelled edges indicate the relationship between the nodes on each end of an edge of the edges. The method 800 may further include, wherein generating the list of resources accessible by the user and related to the extracted content of the calendar event includes determining a minimum number of edges from the calendar event and the respective resources in the resource-relation graph.

tionally or alternatively allow the user to select the meeting to allow user-initiated contextual recommendation.

There are many factors that may potentially affect a resource's usefulness in preparing for a calendar event. First, the amount of content in a resource may be an important factor—the more information a resource has, the more likely it is useful in general. Second, recency in both resource search and personal search (e.g., in a personal search system, users accessed recent items more frequently and issued more queries in which they sorted the results by date). Both recency and the match of who is involved in the resource (e.g., as a sender, receiver, copy contact, author, subject, or the like) and calendar event may be a factor in determining a resource's relevance.

The role (e.g., whether the email is sent by the organizer or attendee) of the involved person might be an important factor. Intuitively, resources that involve the organizer are probably useful for attendees to prepare for the meeting. Content match may be a factor for resource relevance, similar to the match between query and search results in a search system. Four categories of factors are summarized in Table 1 including how each factor may be implemented in a recommender system. Note that these features are non-exhaustive examples of some of the ways these four factors may be captured.

TABLE 1

| Factor Category | Feature Name | Definition |
| --- | --- | --- |
| Amount of Content | Resource Length | Number of words in Title, Subject, and Body |
| Amount of Content | Attachment | Whether, for an email resource, it has an attachment |
| Recency | Recency Score | Time difference between the sent/creation/last saved/last accessed time of the resource and the current time |
| Content Match | Content Match Score | Cosine similarity between word count vector of resource and calendar event content |
| Content Match | Subject Matter Score | Cosine similarity between word count vector of resource and Subject line of calendar event |
| People Match | People Match Score | Jaccard index of the two sets of people - in the resource and the calendar event |
| People Match | From Attendee | Whether the resource was created by an attendee of the calendar event |
| People Match | From Organizer | Whether the resource was created by organizer of the calendar event |

The method 800 may further include, wherein ranking the resources includes ranking the resources by a comparison of a relationship of the respective resources to the calendar event in the resource-relation graph includes assigning a score to respective labels and combining one or more scores, using a supervised machine learning technique, to determine the rank. The method 800 may further include, wherein the resources include one or more of electronic mail, an attachment to the electronic mail, and one or more other documents accessible either stored locally or remotely to the user and accessible by the user.

People may be more likely to prepare for small group meetings or one-on-one meetings compared with larger group meetings. A person's role with respect to the meeting impacts when and whether a person prepares for a meeting, but moreover, meeting preparation is not limited to simply meetings for which a person is a presenter or organizer. Embodiments may account for these results in at least two ways. A people matching feature may differentially weight emails from the organizer versus attendees of a meeting. Embodiments may default to the next upcoming meeting to enable proactive recommendation by default but may addi- Table 1 illustrates extracted features in four categories of factors in predicting resource usefulness for calendar event. To help understand the space of modeling choices, six recommenders are described. The first two (Time and Search) provide non-learning baselines (e.g., they are not based on machine learning models), the next two (Static Linear and Static Hero) provide a learned baseline that does not update with further interaction and are the same but with a recency-based re-ranking. The final two (Online Linear and Online SVD) provide information on the impact of online learning as well as non-linear modeling. These models are described in more depth in Table 2 and below.

Table 1 defines how an initially retrieved email candidate set S is ranked (e.g., the operation 340 of the method 300), except the Time (serving as a baseline) and Search (a simple experimental) condition which replace all the operations 310, 320, and 300 in the method 300, because both the candidate generation and ranking are different in those models. In all cases, both sent and received resources may be considered as candidates since a person may both find utility in the resources they have sent or received. An embodiment may easily be restricted to only resources sent or only resources received.

For the Time condition, the resources may include the most recent resources are ordered from most recent to least recent. This provides a simple baseline based on recency. In the search condition, a simple search a person might perform is replicated to find items for a calendar event, but without the benefit of learning which factors most contribute to relevance. To construct the query, a number of key words may be selected, such as according to the term frequency (TF) inverse document frequency (–IDF) criterion from the TF of the calendar event's subject and IDF from among all the calendar event subjects of the user's upcoming two weeks of calendar events. This may mimic the results of user search but may differ from actual user search (e.g., users do not have the exact information in their mind for upcoming meetings but they may search more effectively than using three key words).

The Static Linear condition may include usefulness labeled email-meeting pairs. With the labeled data, a linear model was trained (through the LinearUCB technique described elsewhere herein) and a singular-value decomposition (SVD) (Factorization Machine) model that predicts the usefulness value of a resource to a calendar event (e.g., value=1.0 if labeled as "Useful", value=0.5 if labeled as "Maybe Useful" and value=0.0 if labeled as "Not Useful").

The learned weights of the linear model may be used by the Static Linear condition and the Online Linear condition. However, the Online Linear condition may continue learning while the task-based experiment is being conducted if a participant adds more labels, thus making the model online. Similarly, the SVD model may be bootstrapped and continue learning during the experiment. Note, these two models may be updated at the same time, such as with the same labeled data points. This may help keep the comparison between these two recommenders fair (e.g., there is no ordering effect).

Time may be an important factor in resource ranking because people have a strong preference for time-based ordering of their emails even in the context of a given search query. The top two relevant search results with respect to the search query may be promoted to the top, following with the complete set of relevant results ordered based on time.

In the SVD (Factorization Machine) model, resource usefulness may be predicted as the following bi-linear function shown in Equation 1:

$$f(W,x)=f(w,U,x_i)=\Sigma_{i=0}^{d} w_i + \Sigma_{i<j, 1<=i,j<=d} U_i^T \cdot U_j \quad \text{Equation 1}$$

Where W=(w, U) are model parameters, w is a parameter vector with length equal to the number of features, d. U is a d×k matrix where k (k=10 in embodiments) is the dimensionality of latent factors representing feature i (i=0, ..., d). By convention, $x_0=1$ so that $W_0$ represents the learned intercept or global bias of the model. Let y be the users' usefulness feedback, the model minimizes an L2 norm (least-squared) loss function using a stochastic gradient descent (SGD) technique of Equation 2, wherein err=y–f. Equation 2:

$$w_i \rightarrow w_i + \eta \cdot err$$

$$U_j \rightarrow U_j + \eta \cdot err \cdot U_j$$

TABLE 2

| Recommender | Technique |
| --- | --- |
| Time | A most recently received (from the Inbox), sent emails (from the Sent folder), saved, accessed, or created ordered by time with the most recent at the top. This is the baseline condition. It may be a weak baseline but may mimic a default presentation of resources in a typical resource client without search. |
| Search | Pick three key words (see below for how they may be picked) from the calendar event subject and proactively issue the query (concatenating the three key words with spaces) to a resource search service. Note that no people information is used for the search in this condition. |
| Static Linear | Linearly combine the four categories of factors by using a static, bootstrapped set of blending weights. |
| Static Hero | On top of the Static Linear condition, pick the top two resources by predicted usefulness and sort the rest by their time with more recent at the top. |
| Online Linear | On top of the Static Linear condition, online update the blending weights based on the LinearUCB (upper confidence bound) technique described below as users add more labels into the system. |
| Online SVD | Use the same set of features as the Online Linear condition, but using a Factorization Machine model trained online as users add more labels into the system using the Stochastic Gradient Descent (SGD) technique described in Equation 1 and Equation 2. |

Table 2 includes a summary of recommender models. The LinearUCB techniques for learning the linear blending weights of the four categories of factors predicting whether a resource is "Useful" (e.g., labeled as 1.0), "Maybe Useful" (e.g., labeled as 0.5) or "Not Useful" (e.g., labeled as 0.0). Data: A sequence of $(x_t, y_t)$ for t=1, ..., T where x represents the features in Table 1 and y represents the user's usefulness feedback.

Parameters: $\beta=1$; d is the dimension of $x_t$. Note that the LinearUCB technique also has an exploration parameter $\alpha$. Equivalently here, we use $\alpha=0$. Essentially, this technique may be used to online estimate a linear regression model.

Figure 9:
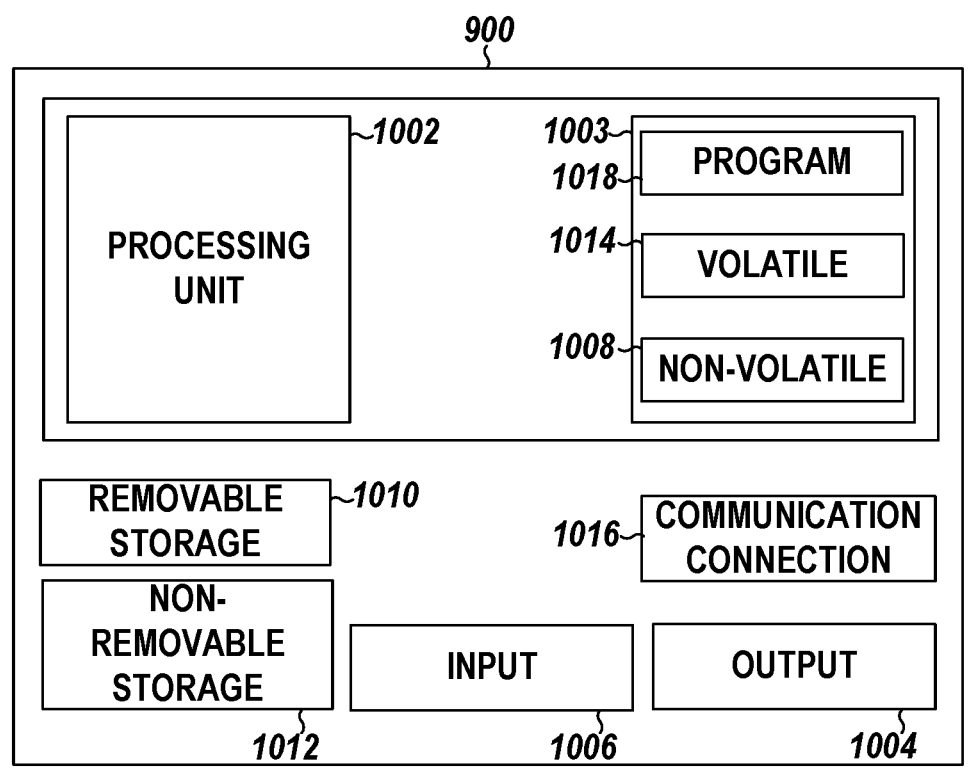
FIG. 9 illustrates, by way of example, a block diagram of an embodiment of a machine (e.g., a computer system) to implement one or more embodiments.

Initialization: $A=\beta I_d$, $b=1_d$, (equal weights for all input features).
for t=1, 2, ..., T do
　　$\theta_t = A^{-1} b$
Let the user's feedback on the usefulness be $y_t$
　　$A \rightarrow A + x_t^T x_t$
　　$b \rightarrow b + x_t y_t$
end
Result: $\theta$ and the linear model is represented as $f(x, \theta) = \theta^T$ FIG. 9 illustrates, by way of example, a block diagram of an embodiment of a machine 900 (e.g., a computer system)

to implement one or more embodiments. One example machine 900 (in the form of a computer), may include a processing unit 1002, memory 1003, removable storage 1010, and non-removable storage 1012. Although the example computing device is illustrated and described as machine 900, the computing device may be in different forms in different embodiments. For example, the computing device may instead be a smartphone, a tablet, smartwatch, or other computing device including the same or similar elements as illustrated and described regarding FIG. 9. Devices such as smartphones, tablets, and smartwatches are generally collectively referred to as mobile devices. Further, although the various data storage elements are illustrated as part of the machine 900, the storage may also or alternatively include cloud-based storage accessible via a network, such as the Internet.

Memory 1003 may include volatile memory 1014 and non-volatile memory 1008. The machine 900 may include— or have access to a computing environment that includes—a variety of computer-readable media, such as volatile memory 1014 and non-volatile memory 1008, removable storage 1010 and non-removable storage 1012. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 900 may include or have access to a computing environment that includes input 1006, output 1004, and a communication connection 1016. Output 1004 may include a display device, such as a touchscreen, that also may serve as an input device. The input 1006 may include one or more of a touchscreen, touchpad, mouse, keyboard, camera, one or more device-specific buttons, one or more sensors integrated within or coupled via wired or wireless data connections to the machine 900, and other input devices. The computer may operate in a networked environment using a communication connection to connect to one or more remote computers, such as database servers, including cloud based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 1002 of the machine 900. A hard drive, CD-ROM, and RAM are some examples of articles including a non-transitory computer-readable medium such as a storage device. For example, a computer program 1018 may be used to cause processing unit 1002 to perform one or more methods or algorithms described herein.

Example 1 includes at least one machine-readable storage medium including instructions for execution by processing circuitry to perform operations comprising extracting content of a calendar event on a personal information management application of a user, the content including: a subject, one or more names of people attending or invited, a name of an organizer, and a date and time of the calendar event, generating a list of resources accessible by the user and related to the extracted content of the calendar event, ranking the resources by a comparison of at least two of: (a) content similarity of respective resources and one or more of the subject and the text in the body, (b) the names of people attending or invited and one or more names of people in the respective resources, (c) a temporal recency of the respective resources; and (d) a relationship of the respective resources to the calendar event in a resource-relation graph, and causing respective summaries of a specified number of the resources with higher respective ranks to be displayed on a user interface.

In Example 2, Example 1 may further include, wherein the operations further comprise receiving, by the user interface, a first indication that the user has selected a summary of the respective summaries, retrieving the resource associated with the selected summary, and causing the selected summary to be displayed on a display.

In Example 3, at least one of Examples 1-2 may further include, wherein the operations further comprise receiving, by the user interface, a second indication of one of: (a) the user has selected a software control to retrieve related items, (b) a specified date and time has elapsed, (c) a specified period of time has elapsed since a last update, and (d) a calendar event is scheduled to begin in a second specified period of time, and wherein extracting the content of the calendar event occurs in response to receiving the second indication.

In Example 4, at least one of Examples 1-3 may further include, wherein the operations further comprise determining, using an online supervised machine learning technique, a feature vector for each resource, the feature vector indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource, and wherein ranking the resource includes ranking the resources based on the determined feature vector.

In Example 5, Example 4 may further include, wherein the feature vector indicates the amount of content in the resource relative to the one or more other resources of the resources and the operations further comprise determining a measure of the number of words in the body and title, combined, and converting the number of words to a quantile based on the amount of content in the resource relative to the one or more other resources.

In Example 6, at least one of Examples 4-5 may further include, wherein the feature vector indicates whether the resource includes one or more attachments or a size of the one or more attachments.

In Example 7, at least one of Examples 4-6 may further include, wherein the feature vector indicates a content similarity between the resource and the content of the calendar event and the operations further comprise determining a similarity between content of the resource and the subject of the calendar event.

In Example 8, at least one of Examples 4-7 may further include, wherein the feature vector indicates a content similarity between the resource and the content of the calendar event and the operations further comprise determining a similarity between content of the resource and the subject and body of the calendar event.

In Example 9, at least one of Examples 4-7 may further include, wherein the feature vector indicates a person match between the name of one or more people attending, invited to, or organizer of the calendar event and the name of one or more people in the resource and the operations further comprise determining a Jaccard index or cosine similarity based on the name of one or more people attending, invited to, or organizer of the calendar event and the name of one or more people in the resource, wherein the name of one or more people in the resource includes one or more of an author or co-author, a sender, a receiver, a copy contact, a person that last modified the resource, or a person mentioned in a body of the resource.

In Example 10, at least one of Examples 4-9 may further include, wherein the feature vector indicates whether the organizer is an author or co-author, a sender, a receiver, a copy contact, a person that last modified the resource, or a person mentioned in a body of the resource.

In Example 11, at least one of Examples 4-10 may further include, wherein the feature vector indicates whether an attendee or invitee of the calendar event is an author or co-author, a sender, a receiver, a copy contact, a person that last modified the resource, or a person mentioned in a body of the resource.

In Example 12, at least one of Examples 1-11 may further include, wherein the operations further comprise generating the resource-relation graph with resources and calendar events as nodes of the connected graph and respective labelled edges between nodes of the connected graph, wherein labels of the labelled edges indicate the relationship between the nodes on each end of an edge of the edges, and wherein generating the list of resources accessible by the user and related to the extracted content of the calendar event includes determining a minimum number of edges from the calendar event and the respective resources in the resource-relation graph.

In Example 13, at least one of Examples 1-12 may further include, wherein ranking the resources includes ranking the resources by a comparison of a relationship of the respective resources to the calendar event in the resource-relation graph includes assigning a score to respective labels and combining one or more scores, using a supervised machine learning technique, to determine the rank.

In Example 14, Example 13 may further include, wherein the resources include one or more of electronic mail, an attachment to the electronic mail, and one or more other documents accessible either stored locally or remotely to the user and accessible by the user.

Example 15 includes a method, performed by at least one processor of a computing system, the method comprising receiving, by a user interface, an indication that a user has selected a recommend resource control of the user interface, responsive to receiving the indication, extracting content of a calendar event on a personal information management application of a user, the content including: a subject, one or more names of people attending or invited, a name of an organizer, a date and time, and text in a body, of the calendar event, generating a list of resources accessible by the user and related to the extracted content of the calendar event, ranking the resources by a comparison of at least two of: (a) content similarity of respective resources and one or more of the subject and the text in the body, (b) the names of people attending or invited and one or more names of people in the respective resources, (c) a temporal recency of the respective resources, and (d) a relationship of the respective resources to the calendar event in a resource-relation graph, and causing respective summaries of a specified number of the resources with higher respective ranks to be displayed on the user interface.

In Example 16, Example 15 may further include receiving, by the user interface, a first indication that the user has selected a summary of the respective summaries, retrieving the resource associated with the selected summary, and causing the selected summary to be displayed on a display.

In Example 17, at least one of Examples 15-16 may further include determining, using an online supervised machine learning technique, a feature vector for each resource, the feature vector indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource, and wherein ranking the resource includes ranking the resources based on the determined feature vector.

In Example 18, Example 17 may further include, wherein the feature vector indicates the amount of content in the resource relative to the one or more other resources of the resources and the operations further comprise determining the number of words in the body and title, combined, and converting the number of words to a quantile based on the amount of content in the resource relative to the one or more other resources.

In Example 19, at least one of Examples 17-18 may further include, wherein the feature vector indicates whether the resource includes one or more attachments.

In Example 20, at least one of Examples 17-19 may further include, wherein the feature vector indicates a content similarity between the resource and the content of the calendar event and the operations further comprise determining a similarity between content of the resource and the subject of the calendar event.

In Example 21, at least one of Examples 17-20 may further include, wherein the feature vector indicates a content similarity between the resource and the content of the calendar event and the operations further comprise determining a similarity between content of the resource and the subject and body of the calendar event.

In Example 22, at least one of Examples 17-20 may further include, wherein the feature vector indicates a person match between the name of one or more people attending, invited to, or organizer of the calendar event and the name of one or more people in the resource and the operations further comprise determining a Jaccard index based on the name of one or more people attending, invited to, or organizer of the calendar event and the name of one or more people in the resource, wherein the name of one or more people in the resource includes one or more of an author or co-author, a sender, a receiver, a copy contact, a person that last modified the resource, or a person mentioned in a body of the resource.

In Example 23, at least one of Examples 17-22 may further include, wherein the feature vector indicates whether the organizer is an author or co-author, a sender, a receiver, a copy contact, a person that last modified the resource, or a person mentioned in a body of the resource.

In Example 24, at least one of Examples 17-23 may further include, wherein the feature vector indicates whether an attendee or invitee of the calendar event is an author or co-author, a sender, a receiver, a copy contact, a person that last modified the resource, or a person mentioned in a body of the resource.

In Example 25, at least one of Examples 17-24 may further include generating the resource-relation graph with resources and calendar events as nodes of the connected graph and respective labelled edges between nodes of the connected graph, wherein labels of the labelled edges indicate the relationship between the nodes on each end of an edge of the edges, and wherein generating the list of resources accessible by the user and related to the extracted content of the calendar event includes determining a minimum number of edges from the calendar event and the respective resources in the resource-relation graph.

In Example 26, at least one of Examples 15-25 may further include, wherein ranking the resources includes ranking the resources by a comparison of a relationship of the respective resources to the calendar event in the resource-relation graph includes assigning a score to respective labels and combining one or more scores, using a supervised machine learning technique, to determine the rank.

In Example 27, Example 26 may further include, wherein the resources include one or more of electronic mail, an attachment to the electronic mail, and one or more other documents accessible either stored locally or remotely to the user and accessible by the user.

Example 28 includes a system comprising a user interface to provide a user access to functionality of a personal information management (PIM) application, the PIM application including a calendar interface, an electronic mail interface, and a recommended resource interface, a processor, and a memory device coupled to the processor, the memory device including a program stored thereon for execution by the processor to perform operations, the operations comprising: determining that a calendar event is scheduled to occur in a specified period of time, responsive to the determination, extracting content of a calendar event on a calendar of the calendar interface, the content including: a subject, one or more names of people attending or invited, a name of an organizer, a date and time, and text in a body, of the calendar event, generating a list of resources accessible by the user and related to the extracted content of the calendar event, ranking the resources by a comparison of at least two of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph, and causing respective summaries of a specified number of the respective resources with higher respective ranks to be displayed on the recommended resource interface.

In Example 29, Example 28 may further include, wherein the operations further comprise receiving, by the user interface, a first indication that the user has selected a summary of the respective summaries, retrieving the resource associated with the selected summary, and causing the selected summary to be displayed on a/the recommended resource interface.

In Example 30, at least one of Examples 28-29 may further include, wherein the operations further comprise determining, using an online supervised machine learning technique, a feature vector for each resource, the feature vector indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource, and wherein ranking the resource includes ranking the resources based on the determined feature vector.

In Example 31, Example 30 may further include, wherein the feature vector indicates the amount of content in the resource relative to the one or more other resources of the resources and the operations further comprise determining the number of words in the body and title, combined, and converting the number of words to a quantile based on the amount of content in the resource relative to the one or more other resources.

In Example 32, at least one of Examples 30-31 may further include, wherein the feature vector indicates whether the resource includes one or more attachments.

In Example 33, at least one of Examples 30-32 may further include, wherein the feature vector indicates a content similarity between the resource and the content of the calendar event and the operations further comprise determining a similarity between content of the resource and the subject of the calendar event.

In Example 34, at least one of Examples 30-33 may further include, wherein the feature vector indicates a content similarity between the resource and the content of the calendar event and the operations further comprise determining a similarity between content of the resource and the subject and body of the calendar event.

In Example 35, at least one of Examples 30-33 may further include, wherein the feature vector indicates a person match between the name of one or more people attending, invited to, or organizer of the calendar event and the name of one or more people in the resource and the operations further comprise determining a Jaccard index or cosine similarity based on the name of one or more people attending, invited to, or organizer of the calendar event and the name of one or more people in the resource, wherein the name of one or more people in the resource includes one or more of an author or co-author, a sender, a receiver, a copy contact, a person that last modified the resource, or a person mentioned in a body of the resource.

In Example 36, at least one of Examples 30-35 may further include, wherein the feature vector indicates whether the organizer is an author or co-author, a sender, a receiver, a copy contact, a person that last modified the resource, or a person mentioned in a body of the resource.

In Example 37, at least one of Examples 30-36 may further include, wherein the feature vector indicates whether an attendee or invitee of the calendar event is an author or co-author, a sender, a receiver, a copy contact, a person that last modified the resource, or a person mentioned in a body of the resource.

In Example 38, at least one of Examples 28-37 may further include, wherein the operations further comprise generating the resource-relation graph with resources and calendar events as nodes of the connected graph and respective labelled edges between nodes of the connected graph, wherein labels of the labelled edges indicate the relationship between the nodes on each end of an edge of the edges, and wherein generating the list of resources accessible by the user and related to the extracted content of the calendar event includes determining a minimum number of edges from the calendar event and the respective resources in the resource-relation graph.

In Example 39, at least one of Examples 28-38 may further include, wherein ranking the resources includes ranking the resources by a comparison of a relationship of the respective resources to the calendar event in the resource-relation graph includes assigning a score to respective labels and combining one or more scores, using a supervised machine learning technique, to determine the rank.

In Example 40, at least one of Examples 28-39 may further include, wherein the resources include one or more of electronic mail, an attachment to the electronic mail, and one or more other documents accessible either stored locally or remotely to the user and accessible by the user.

Example 41 may include a system comprising a display to provide user interface that provides a user access to functionality of a personal information management (PIM) application, the display providing a PIM interface that provides access to functionality of the PIM application, a processor, and a memory device coupled to the processor, the memory device including a program stored thereon, wherein the program, when executed, causes the processor to perform operations comprising determining that a calendar event is scheduled to occur in a specified period of time, responsive to the determination, extracting content of a calendar event on a calendar of the messaging interface, generating a list of resources accessible by the user and related to the extracted content of the calendar event, ranking the resources by a comparison of the extracted content of the calendar event and the content of resources of the list of resources, and causing respective summaries of a specified number of the respective resources with higher respective ranks to be output on the PIM interface.

In Example 42, Example 41 may further include, wherein the operations further comprise receiving, by the user interface, a first indication that the user has selected a summary of the respective summaries, retrieving the resource associated with the selected summary, and causing the resource to be output by the display.

In Example 43, at least one of Examples 41-42 may further include, wherein the content of the calendar event includes a subject, one or more names of people attending or invited, a name of an organizer, a date and time, and text in a body, of the calendar event and ranking the resources includes using at least two of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph.

In Example 44, at least one of Examples 41-43 may further include, wherein the operations further comprise determining, using a model trained using an online supervised machine learning technique, a feature vector for each resource, the feature vector indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource, and wherein ranking the resource includes ranking the resources based on the determined feature vector.

In Example 45, Example 43 may further include, wherein the feature vector indicates the amount of content in the resource relative to the one or more other resources of the resources and the operations further comprise determining the number of words in the body and title, combined, and converting the number of words to a quantile based on the amount of content in the resource relative to the one or more other resources.

In Example 46, at least one of Examples 43-45 may further include, wherein the feature vector indicates whether the resource includes one or more attachments.

In Example 47, at least one of Examples 43-46 may further include, wherein the feature vector indicates a content similarity between the resource and the content of the calendar event and the operations further comprise determining a similarity between content of the resource and the subject of the calendar event.

In Example 48, at least one of Examples 43-47 may further include, wherein the feature vector indicates a content similarity between the resource and the content of the calendar event and the operations further comprise determining a similarity between content of the resource and the subject and body of the calendar event.

In Example 49, at least one of Examples 43-48 may further include, wherein the feature vector indicates a person match between the name of one or more people attending, invited to, or organizer of the calendar event and the name of one or more people in the resource and the operations further comprise determining a Jaccard index or cosine similarity based on the name of one or more people attending, invited to, or organizer of the calendar event and the name of one or more people in the resource, wherein the name of one or more people in the resource includes one or more of an author or co-author, a sender, a receiver, a copy contact, a person that last modified the resource, or a person mentioned in a body of the resource.

In Example 50, at least one of Examples 43-49 may further include, wherein the feature vector indicates whether the organizer is an author or co-author, a sender, a receiver, a copy contact, a person that last modified the resource, or a person mentioned in a body of the resource.

In Example 51, at least one of Examples 43-50 may further include, wherein the feature vector indicates whether an attendee or invitee of the calendar event is an author or co-author, a sender, a receiver, a copy contact, a person that last modified the resource, or a person mentioned in a body of the resource.

In Example 52, at least one of Examples 41-51 may further include, wherein the operations further comprise generating a resource-relation graph with resources and calendar events as nodes of the connected graph and respective labelled edges between nodes of the connected graph, wherein labels of the labelled edges indicate the relationship between the nodes on each end of an edge of the edges, and wherein generating the list of resources accessible by the user and related to the extracted content of the calendar event includes determining a minimum number of edges from the calendar event and the respective resources in the resource-relation graph.

In Example 53, Example 52 may further include, wherein ranking the resources includes ranking the resources by a comparison of a relationship of the respective resources to the calendar event in the resource-relation graph includes assigning a score to respective labels and combining one or more scores, using a machine learning model trained using a supervised machine learning technique, to determine the rank.

In Example 54, at least one of Examples 41-53 may further include, wherein the resources include one or more of electronic mail, an attachment to the electronic mail, and one or more other documents accessible either stored locally or remotely to the user and accessible by the user.

Although a few embodiments have been described in detail above, other modifications are possible. For example, the logic flows depicted in the figures do not require the order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A system comprising:
a display to provide user interface that provides a user access to functionality of a personal information management (PIM) application, the display providing a PIM interface that provides access to functionality of the PIM application;
a processor; and
a memory device coupled to the processor, the memory device including a program stored thereon, wherein the program, when executed, causes the processor to perform operations comprising:
determining that a calendar event is scheduled to occur in a specified period of time;
responsive to the determination, extracting content of a calendar event on a calendar of the PIM application;
generating, by a query of a PIM application database and a database of resources external to the PIM application, a list of resources accessible by the user and related to the extracted content of the calendar event, the query including the extracted content;
ranking the resources by a comparison of the extracted content of the calendar event and resource feature vectors representing content of respective resources of the list of resources, the resource feature vectors generated by a machining learning (ML) technique trained using usefulness labeled resource and calendar event pairs; and
causing respective summaries of a specified number of the respective resources with higher respective ranks to be output on the PIM interface.

2. The system of claim 1, wherein the operations further comprise:
receiving, by the user interface, a first indication that the user has selected a summary of the respective summaries;
retrieving the resource associated with the selected summary; and
causing the resource to be output by the display.

3. The system of claim 1, wherein the content of the calendar event includes a subject, one or more names of people attending or invited, a name of an organizer, a date and time, and text in a body, of the calendar event and the comparison of the feature vector and the calendar event includes at least two of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph.

4. The system of claim 3, wherein the resource feature vector indicates the amount of content in the resource relative to the one or more other resources of the resources and the operations further comprise determining the number of words in the body and title of the resource, combined, and converting the number of words to a quantile based on the amount of content in the resource relative to the one or more other resources.

5. The system of claim 3, wherein the resource feature vector indicates whether the resource includes one or more attachments.

6. The system of claim 3, wherein the resource feature vector indicates a content similarity between the resource and the content of the calendar event and the operations further comprise determining a similarity between content of the resource and the subject of the calendar event.

7. The system of claim 3, wherein the resource feature vector indicates a content similarity between the resource and the content of the calendar event and the operations further comprise determining a similarity between content of the resource and the subject and body of the calendar event.

8. The system of claim 3, wherein the resource feature vector indicates a person match between the name of one or more people attending, invited to, or organizer of the calendar event and the name of one or more people in the resource and the operations further comprise determining a Jaccard index or cosine similarity based on the name of one or more people attending, invited to, or organizer of the calendar event and the name of one or more people in the resource, wherein the name of one or more people in the resource includes one or more of an author or co-author, a sender, a receiver, a copy contact, a person that last modified the resource, or a person mentioned in a body of the resource.

9. The system of claim 3, wherein the resource feature vector indicates whether the organizer is an author or co-author, a sender, a receiver, a copy contact, a person that last modified the resource, or a person mentioned in a body of the resource.

10. The system of claim 3, wherein the resource feature vector indicates whether an attendee or invitee of the calendar event is an author or co-author, a sender, a receiver, a copy contact, a person that last modified the resource, or a person mentioned in a body of the resource.

11. The system of claim 1, wherein:
the resource feature vector includes data indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource.

12. The system of claim 11, wherein the operations further comprise:
generating a resource-relation graph with resources and calendar events as nodes of the connected graph and respective labelled edges between nodes of the connected graph, wherein labels of the labelled edges indicate the relationship between the nodes on each end of an edge of the edges; and
wherein generating the list of resources accessible by the user and related to the extracted content of the calendar event includes determining a minimum number of edges from the calendar event and the respective resources in the resource-relation graph in a meta-path between the calendar event and the respective resources, the meta-path including a score that indicates a likelihood the resource is relevant to the calendar event.

13. The system of claim 12, wherein ranking the resources includes ranking the resources by a comparison of a relationship of the respective resources to the calendar event in the resource-relation graph includes assigning a score to respective labels and combining one or more scores, using a machine learning model trained using a supervised machine learning technique, to determine the rank.

14. The system of claim 13, wherein the resources include one or more of electronic mail, an attachment to the electronic mail, and one or more other documents accessible either stored locally or remotely to the user and accessible by the user, the one or more other documents including one or more documents authored by an entity attending the calendar event, documents authored by an organizer of the calendar event.

15. At least one machine-readable storage medium including instructions for execution by processing circuitry to perform operations comprising:
extracting content of a calendar event on a personal information management (PIM) application, the content including:
a subject, one or more names of people attending or invited, a name of an organizer, and a date and time of the calendar event;
identifying, by a query of the PIM application database and a database of resources external to the PIM application, a list of resources accessible by the user and related to the extracted content of the calendar event;
ranking the resources by a comparison of a feature vector of respective resources of the list of resources and the extracted content to determine at least one of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph, the feature vectors generated by a machining learning (ML) technique trained using usefulness labeled resource and calendar event pairs; and
causing respective summaries of a specified number of the resources with higher respective ranks to be displayed on a display.

16. The at least one machine-readable storage medium of claim 15, wherein the operations further comprise:
receiving, by the user interface, a first indication that the user has selected a summary of the respective summaries;
retrieving the resource associated with the selected summary; and
causing the retrieved resource to be displayed on the display.

17. The at least one machine-readable storage medium of claim 15, wherein the operations further comprise:
receiving, by the user interface, a second indication of one of: (a) the user has selected a software control to retrieve related items, (b) a specified date and time has elapsed, (c) a specified period of time has elapsed since a last update, and (d) a calendar event is scheduled to begin in a second specified period of time; and
wherein extracting the content of the calendar event occurs in response to receiving the second indication.

18. The at least one machine-readable storage medium of claim 15, wherein:
the feature vector includes data indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource.

19. A method, performed by at least one processor of a computing system, the method comprising:
receiving, by a user interface, an indication that a user has selected a recommended resource control of the user interface;
responsive to receiving the indication, extracting content of a calendar event on a personal information management application of a user, the content of the calendar event including: a subject, one or more names of people attending or invited, a name of an organizer, a date and time, and text in a body, of the calendar event;
generating, by a query of a personal information management (PIM) application database and a database of resources external to the PIM application, a list of resources accessible by the user and related to the extracted content of the calendar event;
ranking the resources by a comparison of a feature vector of respective resources of the list of resources and the extracted content to determine at least two of: (a) content similarity of respective resources and one or more of the subject and the text in the body; (b) the names of people attending or invited and one or more names of people in the respective resources; (c) a temporal recency of the respective resources; and (d) a relationship of the respective resources to the calendar event in a resource-relation graph; and
causing respective summaries of a specified number of the resources with higher respective ranks to be displayed on the user interface.

20. The method of claim 19, wherein:
the feature vector includes data indicating three or more of: (a) an amount of content in the resource relative to one or more other resources of the resources, (b) a temporal recency of the resource relative to one or more other resources of the resources, (c) a content similarity between the resource and the content of the calendar event, and (d) a person match between the name of one or more people attending, invited to, or organizer of the calendar event and the name of one or more people in the resource.

\* \* \* \* \*